United States Patent [19]

Watanabe

[11] Patent Number: 5,025,924
[45] Date of Patent: Jun. 25, 1991

[54] CONTAINER

[75] Inventor: Toshimitsu Watanabe, Tokyo, Japan

[73] Assignee: Toppan Printing Co., Ltd., Japan

[21] Appl. No.: 436,543

[22] Filed: Nov. 14, 1989

[30] Foreign Application Priority Data

Nov. 16, 1988 [JP] Japan .................................. 63-149559

[51] Int. Cl.$^5$ .............................................. B65D 85/48
[52] U.S. Cl. .................................... 206/334; 206/454
[58] Field of Search ............... 206/328, 329, 334, 454, 206/455; 211/41; 248/316.2, 316.5

[56] References Cited

U.S. PATENT DOCUMENTS

| 3,850,296 | 11/1974 | Hirata et al. | 206/334 |
| 4,520,925 | 6/1985 | Johnson | 206/334 |
| 4,574,950 | 3/1986 | Koe et al. | 206/334 |
| 4,718,549 | 1/1988 | Rissotti et al. | 206/334 |
| 4,721,207 | 1/1988 | Kikuchi | 206/334 |
| 4,793,488 | 12/1988 | Mortensen | 206/334 X |
| 4,817,799 | 4/1989 | Gregerson et al. | 206/334 X |
| 4,858,764 | 8/1989 | Domokos | 206/334 X |
| 4,886,169 | 12/1989 | Ayers et al. | 206/334 X |

Primary Examiner—Jimmy G. Foster
Assistant Examiner—Jacob K. Ackun, Jr.
Attorney, Agent, or Firm—Lerner, David, Littenberg, Krumholz & Mentlik

[57] ABSTRACT

A container for electronic parts consists of a case, a plurality of inner bodies placed in the case and a plurality of lid members corresponding to the inner bodies. Each lid member includes at least one supporting structure consisting of a pair of resilient front end portions curved in a horseshoe shape and defining a hollow or space between them. The opposed sidewalls of the inner bodies include a plurality of opposed vertical supporting grooves for receiving plate-like contents, such as photomasks or photomask blanks. The front end portions of the supporting structures contact the corners of the plate-like contents to hold same securely in place. The resilient nature of the front end portions accomodates any expansion or contraction in the contents which results from a thermal change within the container.

23 Claims, 4 Drawing Sheets

CONTAINER

FIELD OF THE INVENTION

The present invention relates to a container suitable for transferring electronic parts, such as photomasks and their blanks, and more particularly to a container provided with supporting portions or means enabling any volume change in the plate-like contents of the container to be accommodated, even when the contents and the container are exposed to a sudden thermal change, thereby preventing the contents from being broken or damaged as a result of stress and strain.

BACKGROUND OF THE INVENTION

After newly designed photomasks and photomask blanks for electronic parts are manufactured in design or R & D departments, they are often transferred as samples to users of the products or to facilities in which they are mass-produced.

As is well known, photomasks are very sensitive, so that if a single particle of dust becomes attached to and/or a single or slight scar becomes formed on the photomask or the blank, the initial-designed function of the photomask becomes impaired. As a result, it is necessary to pay careful attention to the handling of the photomasks. Should a single dust particle become attached to and/or a single or slight scar be formed on the blanks for the photomasks, the initial-designed function of the blank will not be attainable, depending on the degree of defects in the photomask blank.

In order to solve the problems inherent in the conventional technology, the photomasks and photomask blanks are ordinarily contained in a plastic container, the gap between the container body and lid being completely sealed by adhesive tape or the like in order to make the container air tight before being transferred. This approach to handling the photomasks and photomask blanks is typically employed in the handling of spectroscopes, color filters and the like.

Recently, airplanes have been used to transfer goods in order to shorten the transfer time. It is well-known that there is no temperature or pressure control within the cargo sections of airplanes as there is in the passenger compartment. In particular, in airplanes traveling at high altitude along international air routes, the cargo sections experience pressures as low as 0.5 atmospheres and temperatures of less than 30° C. Sudden changes in the environmental conditions within the cargo sections result in expansions and contractions of the containers and the contents therein. Such expansions and contractions create stresses which frequently result in breakage of the goods.

Obviously, the photomasks and the blanks for photomasks cannot be used and must be disposed of when large sections thereof are broken. Even if the photomask or the blank becomes chipped, the tiny chip often adheres to the surface of the photomask or the blank, thereby requiring its disposal.

In order to solve the problem associated with transferring such products by airplane, couriers often pack the containers in their bags and carry them in the passenger compartment until they arrive at their destination. This is not an ideal solution owing to the high cost of fares for a person relative to cargo fees and the fact that a preferable shipping arrangement may be missed due to the unavailability of a courier. The container transfer method using the cargo section of an airplane is very convenient, however, because the cargo section can be used during any airplane flight. Consequently, there is a need for a suitable container which is able to contain goods and be transferred in the cargo section of an airplane. Preferably, such container can be used to transfer not only photomasks and photomask blanks, but also electroscopes and color filters, all without breakage.

SUMMARY OF THE INVENTION

The container of the present invention solves the shortcomings of the conventional technology. Accordingly, it is the purpose of the present invention to provide a container consisting of a container body and a lid member for the body. The container includes supporting grooves formed in a pair of opposed sidewalls of the container body, and horseshoe-shaped supporting means formed from resilient material installed within the lid member, the supporting means being able to rotate in the plane of the supporting grooves. The supporting means consists of two parts each having front end portions facing the supporting groove and disposed to contact the edge of the plate-like goods which are to be inserted in the supporting grooves. The front end portion of at least one part of the supporting means has notches for engaging the edges of the plate-like goods.

In accordance with the structural characteristics of the container of the present invention, the goods are inserted into the supporting grooves formed in the opposed sidewalls of the container body. The lid is then attached to the container body so that both front end portions of the supporting means contact the edges of the goods. The resilient horseshoe shape of the supporting mean enables the goods to be held firmly in place. At least one part of the supporting means has notches which receive the edges of the container's contents and prevent same from shifting or moving transversely. Exposure to a sudden and large thermal change generates an excessive expansion or contraction of the container body and the lid member, thereby resulting in a large size difference between the container body and the contents therein. Under such circumstances, this size difference is absorbed by a change in the separating distance between the confronting front end portions of the supporting means. As a result, there are no large stresses induced in the contents, nor is there any slack developed in the manner in which the contents are held by the supporting means.

DESCRIPTION OF THE PREFERRED EMBODIMENTS

Figure 1:
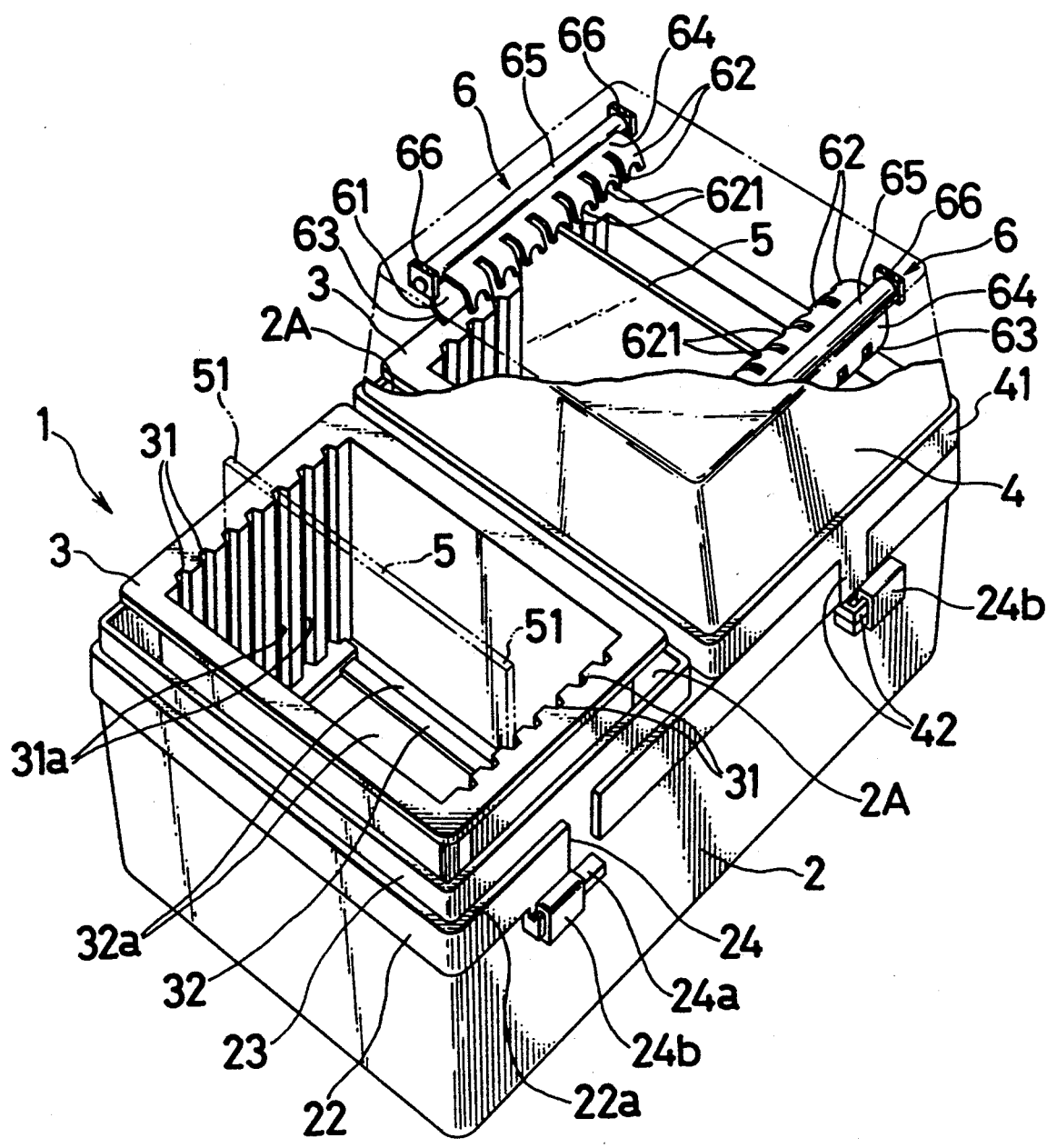
FIG. 1 is a perspective view of the container of the present invention, one lid member being removed to reveal the interior thereof, and another lid member being broken away to reveal the supporting means.
Figure 2:
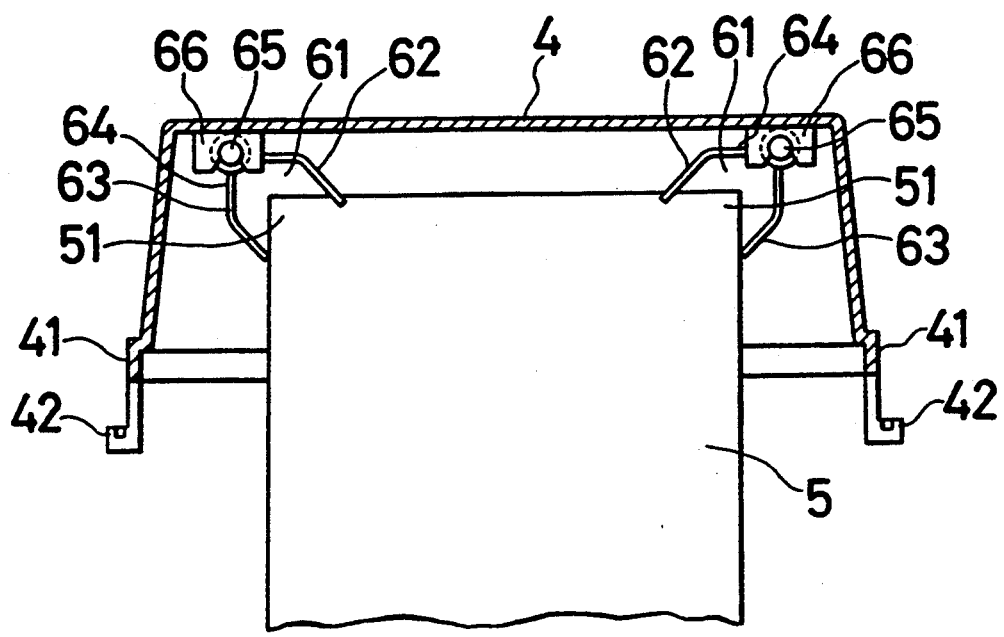
FIG. 2 is an enlarged sectional view of one lid member of the container shown in FIG. 1.
Figure 3:
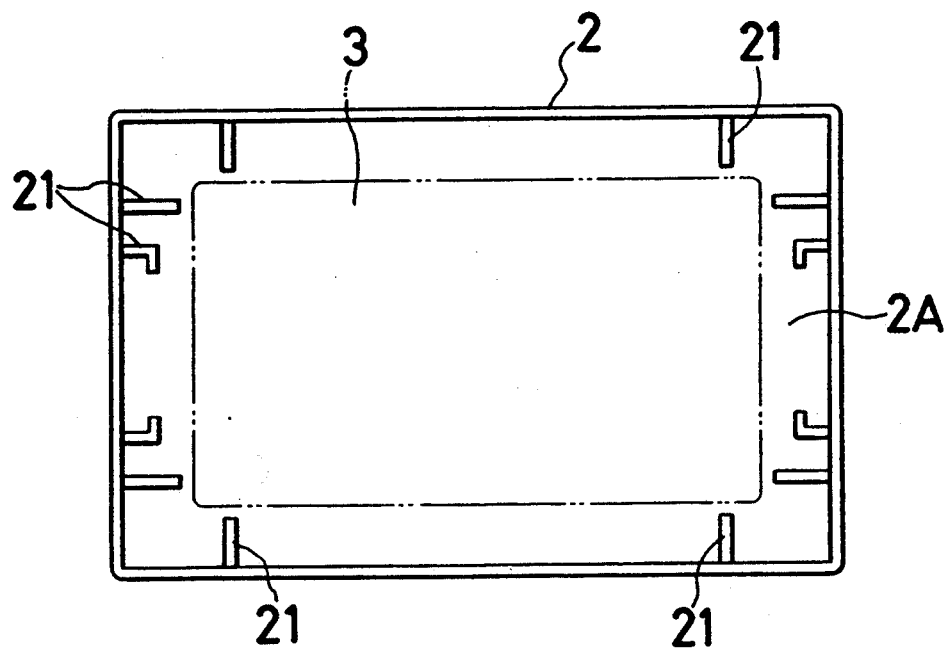
FIG. 3 is a top plan view of the outer case of the container shown in FIG. 1.

The preferred embodiments of the container in accordance with the present invention will now be described with reference to the drawings. As shown in FIG. 1, the container body 1 consists of a case 2 having two similarly shaped receiving portions 2A and two inner containers 3 inserted into the receiving portions 2A. Lid members 4 are removably applied to the container body 1.

Each inner container 3 has a pair of opposed sidewalls on which a plurality of vertically extending supporting grooves 31 are formed. Each sidewall may include, for example, seven such supporting grooves as shown in FIG. 1. The horizontal cross-section of each groove 31 has a trapezoidal shape which tapers from a larger thickness at the open edge of the groove closest to the interior of container 3 to a narrower thickness at the closed edge farthest from the interior of container 3, thereby facilitating the insertion of the plate-like contents, such as photomask blanks. The thickness of the narrowest portion of each supporting groove 31 along the closed edge thereof is greater than the thickness of a photomask or photomask blank, thereby incorporating a clearance which prevents the edge portions of the photomask or photomask blank from being forcibly squeezed by the walls of the supporting groove 31 when the container is exposed to a sudden and large thermal change which causes either an expansion or contraction of the photomask blank and the container body. Each supporting groove 31 includes a lower groove portion which extends vertically to about the middle of the supporting groove. The lower groove portions each have a slit 31a formed in the closed edge of the supporting groove which leads to the outside of inner container 3. In addition, each inner container 3 has an open bottom 32a which incorporates thin strengthening members 32 as shown in FIG. 1. As a result, by enabling the inner container 3 to be taken out of case 2 and dipped in a washing tub (not shown), the container of the present invention facilitates the cleaning of the photomask blanks contained therein.

A pair of supporting means 6 are installed at both the inner corners of the top plate of lid member 4. These supporting means 6 face the supporting grooves 31. Each of the supporting means 6 includes a pair of front end portions 62 and 63, formed from a resilient material, which take the shape of a horseshoe about space 61. The supporting means 6 are placed as shown in FIG. 1 above the top of the inner container 3 so that the front end portions 62 and 63 engage the top and side edges of the upper corners 51 of photomask blanks 5. Semi-circular shaped notches 621 formed at the center of upper front end portions 62 receive the top edges of photomask blank 5 in a snug and stable fashion. The lower front end portions 63 are formed with a straight edge which enables blanks 5 to be held stably by pressing against the side edges thereof.

According to the first embodiment of the present invention, each supporting means 6 includes seven pairs or combinations of front end portions 62 and 63 corresponding to the seven supporting grooves 31 formed in each inner container 3. Each supporting means 6 further includes a rotation shaft 65 integrally formed with the curved rear ends of front end portions 62 and 63. The ends of rotation shafts 65 are held by a pair of bearings 66 which enable front end portions 62 and 63 to rotate in the vertical planes in which the blanks 5 are held in the container. Since the front end portions 62 and 63 of the supporting means 6 are made from a resilient material they act like leaf springs upon encountering an outside force. That is, front end portions 62 and 63 will straighten from their curved shapes upon application of an outside force therebetween, but will return to their original curved shapes upon removal of that force. The magnitude of the outside force applied to front end portions 62 and 63 determines the degree to which the shapes thereof change.

Several flanges 21 extend horizontally from the bottom or lower portion of the case 2 to stably hold the inner container 3. The size or length of the flanges 21 includes an allowance or surplus which accommodates the expansion or contraction of the photomask blanks 5 in the container. Plate-like bulged or swelled portions 22 are formed on the sidewalls of the case 2 and extend horizontally parallel to the upper edges of case 2. As a lid member 4 is applied to the inner container 3, the peripheral open edges 41 of the lid member engage the upper peripheral wall portion 23 of the case 2, the open edges 41 of the lid member contacting the upper edges of the bulge portion 22 to form a level contacting line and double-walled portion. As a result, the double-walled portion, consisting of the upper peripheral wall portion 23 of the case 2 and the lower edge of the lid member 4, prevents dust and the like from entering into the inner container 3 of the container body 1. The level contacting line may then be sealed by an adhesive tape or other sealing material in order to ensure such protection.

The bulge portion 22 extending horizontally around the peripheral portion of case 2 has four broken or discontinuous portions 24 at positions corresponding to the short sidewalls of each inner container 3. A lock means 42 formed on the peripheral open edges 41 of the lid member 4 is disposed to engage with another lock means 24b integrally formed with a C-shaped cross-section in the bulged portion 22. A bolt 24a is disposed within lock means 24b to slidably engage with the lock means 42 on lid member 4. The present invention is not limited to the particular locking structure described above. Therefore, any locking structure may be employed which secures lid members 4 to case 2 in a suitable fashion.

In the operation of the container in accordance with the present invention, plate-like items, such as photomask blanks 5, are inserted or fitted into the supporting grooves 31 formed on the opposed sidewalls of each inner container 3. As a lid member 4 is applied to cover each inner container 3, the notches 621 formed on the front end portions 62 of the supporting means 6 first contact the top edges of the upper corners 51 of photomask blanks 5. Consequently, the front end portions 62 are pressed upwardly as a result of the height of photomask blanks 5 in relation to the position of the supporting means 6. This causes rotating shafts 65 to rotate until the straight edges of lower front end portions 63 contact the side edges of corners 51. As a result, the corners 51 of the photomask blanks 5 are held within the spaces or hollows 61 in supporting means 6, the top and side edges of corners 51 being pressed downwardly and sidewardly, respectively, to hold the photomask blanks 5 in a stable manner. Upon exposure to a sudden thermal change which causes photomask blanks 5 to expand suddenly and largely relative to the material of the inner container 3, the right and left corners 51 of the blank 5 will not only expand away from one another, but will also expand in an upward direction. In response, the front end portions 62 and 63 will spread apart, the sharp corners 51 of photomask blanks 5 penetrating more deeply into space 61. As a result of this unrestricted movement, no large compressive stresses are generated in the photomask blanks 5. On the other hand, should a sudden thermal change cause photomask blanks 5 to contract more than the inner container 3, the resultant reduction in force will cause front end portions 62 and 63 to approach one another, thereby accommodating the contraction of the photomask blanks 5. Hence, no gap or clearance is ever formed between the photomask blanks 5 and the front end portion 62 and 63 and the photomask blanks are always held firmly in place. Each and every expansion and contraction of either the photomask blanks 5 or the container 3 are therefore accommodated without difficulty by supporting means 6.

Inasmuch as the container of the present invention is adapted to transport electronic parts, such as photomask blanks 5 or photomasks, it is preferable to manufacture the case 2, the inner containers 3 and the lid members 4 from a material which will prevent damage to the electronic parts from static electricity. One such material is an ABS resin material dispersed with particles which facilitate the discharge of static electricity and etched to improve the conduction of electricity. Other such materials include acrylic resin, polypropylene resin, polyethylene resin and the like, which have been treated to improve conduction of electricity.

Figure 4:
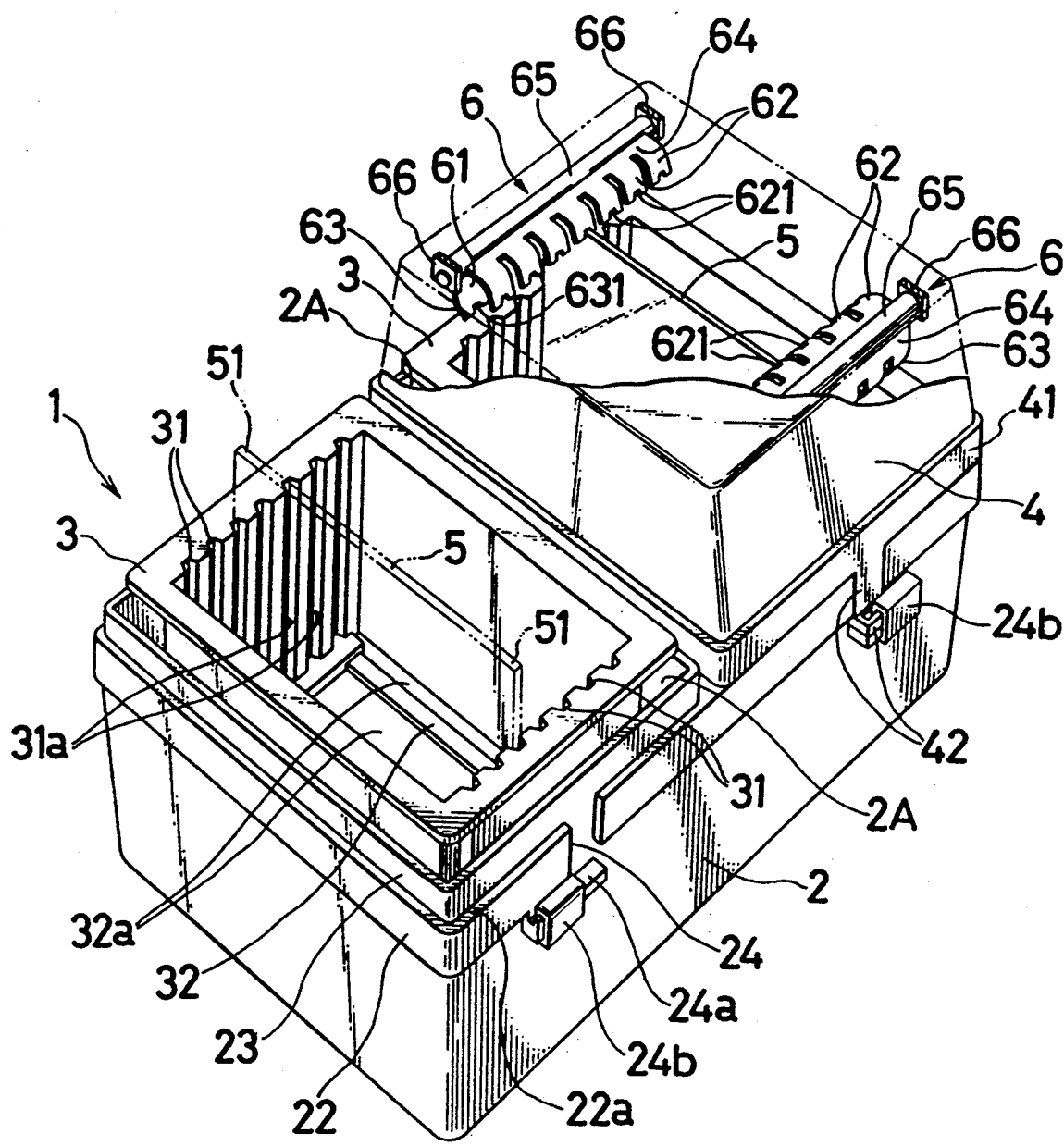
FIG. 4 is a perspective view of another embodiment of the container of the present invention, one lid member being removed to reveal the interior thereof, and another lid member being broken away to reveal the supporting means.
Figure 5:
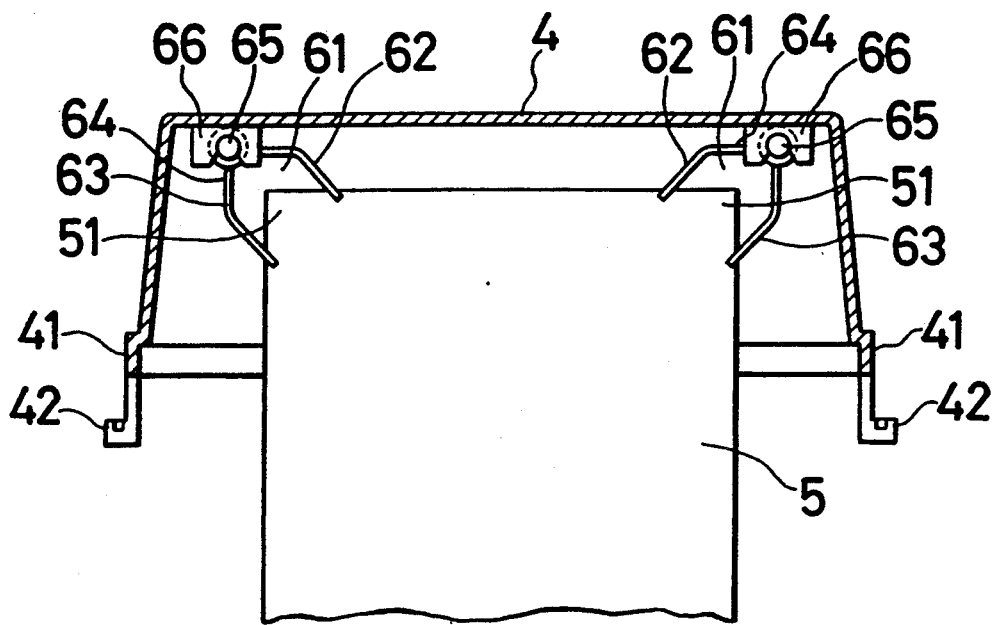
FIG. 5 is an enlarged sectional view of one lid member of the container shown in FIG. 4.

In a second embodiment of the container of the present invention, as shown in FIGS. 4 and 5, the front end portions 62 and 63 are each formed with notches 621 and 631, respectively. As in the first embodiment, the front end portions 62 and 63 may be integrally formed with rotating shaft 65 or connected thereto. Since notches 621 and 631 simultaneously hold the top and side edges of corners 51, the photomask blank 5 is held more securely and firmly in place. In yet another embodiment only the side edges of corners 51 may be held by providing notches in only the lower front end portions 63.

In those case where the plate-like contents of the container are circular or disc-shaped, it is necessary to install at least one supporting means 6 at the top center of each lid member 4. The at least one supporting means 6 can be fixed in the interior of the lid member 4 in a horizontal orientation. The present invention further contemplates that container body 1 may be manufactured so that the case 2 and inner containers 3 are not separable, but are united or integrated in a single structure. In such a structure, inner containers 3 may not be removed from case 2 in order to clean the photomask blanks 5 stored therein.

As a result of its unique structure, the improved container of the present invention enables electronic goods or parts contained therein to be shipped in the cargo section of an airplane without damage. Therefore, the parts may be shipped without delay and at minimum cost to the manufacturer.

What is claimed is:

1. A container for plate-like articles comprising,
    a case having at least one inner compartment, said at least one inner compartment having an open top and a pair of opposed sidewalls,
    at least one removable lid member for enclosing said open top of said at least one inner compartment,
    a plurality of vertical supporting grooves disposed on said pair of opposed sidewalls of said at least one inner compartment,
    supporting means disposed on an inner surface of said at least one removable lid member for supporting said plate-like articles, said supporting means including a supporting member having first and second extending resilient arm portions for engaging adjacent peripheral edges of said plate-like articles, said supporting member adapted to be rotated about a central axis relative to said lid member.

2. The container as claimed in claim 1 wherein said first and second extending resilient arm portions concavely curve toward one another.

3. The container as claimed in claim 1, wherein said first extending resilient arm portion includes a plurality of notches for receiving said peripheral edges of said plate-like articles.

4. The container as claimed in claim 1 wherein said first extending resilient arm portion includes a plurality of extending resilient arm members for engaging said peripheral edges of said plate-like articles.

5. The container as claimed in claim 4 wherein each of said plurality of extending resilient arm members includes a notch for receiving said peripheral edges of said plate-like articles.

6. The container as claimed in claim 4 wherein said second extending resilient arm portion includes a plurality of extending resilient arm members for engaging said peripheral edges of said plate-like articles.

7. The container as claimed in claim 6 wherein each of said plurality of extending resilient arm members includes a notch for receiving said peripheral edges of said plate-like articles.

8. The container as claimed in claim 1 wherein said plate-like articles have a rectangular cross-section including a top edge and side edges, said first extending resilient arm portion engaging said top edge of said plate-like articles and said second extending resilient arm portion engaging one of said side edges of said plate-like articles.

9. The container as claimed in claim 1 wherein said at least one inner compartment removably resides within said case.

10. The container as claimed in claim 9 wherein said at least one inner compartment has an open bottom to permit a liquid to pass therethrough.

11. A container for plate-like articles comprising,
    a case having at least one inner compartment, said at least one inner compartment having an open top and a pair of opposed sidewalls,
    at least one removable lid member for enclosing said open top of said at least one inner compartment,
    a plurality of vertical supporting grooves disposed on said pair of opposed sidewalls of said at least one inner compartment,
    at least two supporting means disposed on an inner surface of said at least one removable lid member for supporting said plate-like articles, said supporting means including first and second extending resilient arm portions concavely curved toward one another, said first extending resilient arm portion disposed to engage one peripheral edge of said plate-like articles with a downward force and said second extending resilient arm portion disposed to engage another peripheral edge of said plate-like articles with a transverse force.

12. The container as claimed in claim 11 wherein each of said at least two supporting means includes a supporting member adapted to be rotated about a central axis relative to said lid member.

13. The container as claimed in claim 11 wherein said first extending resilient arm portion includes a plurality of notches for receiving said peripheral edges of said plate-like articles.

14. The container as claimed in claim 11 wherein said first extending resilient arm portion includes a plurality of extending resilient arm members for engaging said peripheral edges of said plate-like articles.

15. The container as claimed in claim 14 wherein each of said plurality of extending resilient arm members includes a notch for receiving said peripheral edges of said plate-like articles.

16. The container as claimed in claim 14 wherein said second extending resilient arm portion includes a plurality of extending resilient arm members for engaging said peripheral edges of said plate-like articles.

17. The container as claimed in claim 16 wherein each of said plurality of extending resilient arm members includes a notch for receiving said peripheral edges of said plate-like articles.

18. The container as claimed in claim 14 wherein said plate-like articles have a rectangular cross-section including a top edge and side edges, said first extending resilient arm portion engaging said top edge of said plate-like articles and said second extending resilient arm portion engaging one of said side edges of said plate-like articles.

19. The container as claimed in claim 11 wherein said at least one inner compartment removably resides within said case.

20. The container as claimed in claim 19 wherein said at least one inner compartment has an open bottom to permit a liquid to pass therethrough.

21. A container for plate-like articles comprising,
a case having at least one inner compartment, said at least one inner compartment having an open top and a pair of opposed sidewalls,
at least one removable lid member for enclosing said open top of said at least one inner compartment,
a plurality of vertical supporting grooves disposed on said pair of opposed sidewalls of said at least one inner compartment, and
supporting means disposed on an inner surface of said at least one removable lid member for supporting said plate-like articles, said supporting means including first and second extending resilient arm portions concavely curved toward one another for engaging adjacent peripheral edges of said plate-like articles.

22. A container for plate-like articles having a rectangular cross-section including a top edge and side edges comprising,
a case having at least one inner compartment, said at least one inner compartment having an open top and a pair of opposed sidewalls,
at least one removable lid member for enclosing said open top of said at least one inner compartment,
a plurality of vertical supporting grooves disposed on said pair of opposed sidewalls of said at least one inner compartment, and
supporting means disposed on an inner surface of said at least one removable lid member for supporting said plate-like articles, said supporting means including a first extending resilient arm portion having a free end engaging said top edge of said plate-like articles and a second extending resilient arm portion having a free end engaging one of said side edges of said plate-like articles.

23. A container for plate-like articles having a rectangular cross-section including a top edge and side edges comprising,
a case having at least one inner compartment, said at least one inner compartment having an open top and a pair of opposed sidewalls,
at lest one removable lid member for enclosing said open top of said at least one inner compartment,
a plurality of vertical supporting grooves disposed on said pair of opposed sidewalls of said at least one inner compartment, and
at least two supporting means disposed on an inner surface of said at least one removable lid member for supporting said plate-like articles, said supporting means including a first extending resilient arm portion having a free end engaging said top edge of said plate-like articles with a downward force and a second extending resilient arm portion having a free end engaging one of said side edges of said plate-like articles with a transverse force.

* * * * *

UNITED STATES PATENT AND TRADEMARK OFFICE
CERTIFICATE OF CORRECTION

PATENT NO. : 5,025,924

DATED : June 25, 1991

INVENTOR(S) : Watanabe

It is certified that error appears in the above-identified patent and that said Letters Patent is hereby corrected as shown below:

Column 7, line 25, "claim 14" should read --claim 11--.

Signed and Sealed this

Thirteenth Day of October, 1992

Attest:

DOUGLAS B. COMER

Attesting Officer

Acting Commissioner of Patents and Trademarks